(12) United States Patent
Shen et al.

(10) Patent No.: US 9,322,892 B2
(45) Date of Patent: *Apr. 26, 2016

(54) SYSTEM FOR MAGNETIC FIELD DISTORTION COMPENSATION AND METHOD OF MAKING SAME

(71) Applicant: General Electric Company, Schenectady, NY (US)

(72) Inventors: Weijun Shen, Florence, SC (US); Timothy John Havens, Florence, SC (US); Longzhi Jiang, Florence, SC (US); Saikat Saha, Waukesha, WI (US); Benjamin Jacob Gronemeyer, Florence, SC (US); Venkata Kishore Mogatadakala, Lexington, SC (US)

(73) Assignee: General Electric Company, Schenectady, NY (US)

( * ) Notice: Subject to any disclaimer, the term of this patent is extended or adjusted under 35 U.S.C. 154(b) by 424 days.

This patent is subject to a terminal disclaimer.

(21) Appl. No.: 13/726,278

(22) Filed: Dec. 24, 2012

(65) Prior Publication Data

US 2013/0157865 A1    Jun. 20, 2013

Related U.S. Application Data

(63) Continuation-in-part of application No. 13/690,312, filed on Nov. 30, 2012.

(60) Provisional application No. 61/577,805, filed on Dec. 20, 2011.

(51) Int. Cl.
*G01V 3/00* (2006.01)
*G01R 33/3875* (2006.01)
(Continued)

(52) U.S. Cl.
CPC ...... *G01R 33/3875* (2013.01); *G01R 33/34023* (2013.01); *G01R 33/56518* (2013.01); *G01R 33/3804* (2013.01); *G01R 33/3815* (2013.01); *Y10T 29/49014* (2015.01)

(58) Field of Classification Search
CPC .......... G01R 33/3815; G01R 33/3875; G01R 33/3873; G01R 33/3854; G01R 33/4215; G01R 33/387; G01R 33/42; G01R 33/5655; G01R 33/34023; G01R 33/56518
USPC ................................................. 324/300–322
See application file for complete search history.

(56) References Cited

U.S. PATENT DOCUMENTS 3,665,351 A *   5/1972  Donaldson et al. ........... 335/216
4,585,995 A     4/1986  Flugan
(Continued)

FOREIGN PATENT DOCUMENTS

CN    1509684 A    7/2004
CN    1542876 A    11/2004
(Continued)

OTHER PUBLICATIONS

Jiang, et al., Vibration Induced Eddy Current and Its Effect on Image Quality for MRI System, Proc. Intl. Soc. Mag. Reson. Med. 16, 2008.*

(Continued)

*Primary Examiner* — Daniel Miller
(74) *Attorney, Agent, or Firm* — Ziolkowski Patent Solutions Group, SC (57) ABSTRACT

A system and method for magnetic field distortion compensation includes a cryostat for a magnetic resonance imaging (MRI) system. The cryostat includes a vacuum casing having a vacuum therein. A cryogen vessel is disposed within the casing, the vessel having a coolant therein. A thermal shield is disposed between the vacuum casing and the cryogen vessel. An eddy current compensation assembly is disposed within the casing. The eddy current compensation assembly includes a plurality of electrically conductive loops formed on one of the vacuum casing, the cryogen vessel, and the thermal shield and constructed to mitigate vibration-induced eddy currents in the MRI system.

19 Claims, 8 Drawing Sheets

(51) Int. Cl.
*G01R 33/34* (2006.01)
*G01R 33/565* (2006.01)
*G01R 33/38* (2006.01)
*G01R 33/3815* (2006.01)

(56) References Cited

U.S. PATENT DOCUMENTS

| | | | |
|---|---|---|---|
| 4,623,844 A | 11/1986 | Macovski | |
| 4,684,889 A | 8/1987 | Yamaguchi et al. | |
| 4,685,468 A | 8/1987 | Macovski | |
| 4,698,591 A | 10/1987 | Glover et al. | |
| 4,703,275 A | 10/1987 | Holland | |
| 4,733,189 A | 3/1988 | Punchard et al. | |
| 4,885,542 A | 12/1989 | Yao et al. | |
| 4,970,457 A | 11/1990 | Kaufman et al. | |
| 5,179,338 A | 1/1993 | Laskaris et al. | |
| 5,291,169 A | 3/1994 | Ige et al. | |
| 5,302,899 A | 4/1994 | Schett et al. | |
| 5,317,297 A | 5/1994 | Kaufman et al. | |
| 5,450,010 A | 9/1995 | Van Der Meulen et al. | |
| 5,453,010 A | 9/1995 | Klein | |
| 5,455,512 A | 10/1995 | Groen et al. | |
| 5,548,653 A | 8/1996 | Pla et al. | |
| 5,631,616 A | 5/1997 | Ohta et al. | |
| 5,668,516 A | 9/1997 | Xu et al. | |
| 5,706,575 A | 1/1998 | Kaufman et al. | |
| 5,782,095 A * | 7/1998 | Chen | 62/47.1 |
| 6,147,494 A * | 11/2000 | Ham | 324/318 |
| 6,157,276 A | 12/2000 | Hedeen et al. | |
| 6,246,308 B1 | 6/2001 | Laskaris et al. | |
| 6,326,788 B1 | 12/2001 | Mulder et al. | |
| 6,448,773 B1 | 9/2002 | Zhang | |
| 6,783,059 B2 | 8/2004 | Laskaris et al. | |
| 6,807,812 B2 | 10/2004 | Lehmann et al. | |
| 6,822,446 B2 | 11/2004 | Havens et al. | |
| 6,850,066 B2 | 2/2005 | Havens et al. | |
| 6,977,571 B1 | 12/2005 | Hollis et al. | |
| 7,034,537 B2 | 4/2006 | Tsuda et al. | |
| 7,112,964 B2 | 9/2006 | Zhou et al. | |
| 7,141,970 B2 | 11/2006 | Miyawaki et al. | |
| 7,208,952 B2 | 4/2007 | Dietz | |
| 7,352,184 B2 | 4/2008 | Komuro et al. | |
| 7,372,265 B2 | 5/2008 | Ham et al. | |
| 7,372,271 B2 | 5/2008 | Roozen et al. | |
| 7,432,712 B2 | 10/2008 | Motoshiromizu et al. | |
| 7,722,089 B2 | 5/2010 | Nauer | |
| 7,928,820 B2 | 4/2011 | Chiba et al. | |
| 2003/0179060 A1 | 9/2003 | Wang et al. | |
| 2004/0113619 A1* | 6/2004 | Schuster et al. | 324/318 |
| 2004/0113620 A1 | 6/2004 | Tsuda et al. | |
| 2005/0179435 A1* | 8/2005 | Coughlin | 324/318 |
| 2006/0113997 A1 | 6/2006 | Miyamoto | |
| 2008/0168777 A1 | 7/2008 | Atkins et al. | |
| 2012/0274323 A1* | 11/2012 | He | 324/309 |
| 2013/0154648 A1* | 6/2013 | Shen et al. | 324/322 |
| 2013/0157865 A1 | 6/2013 | Shen et al. | |
| 2013/0229065 A1 | 9/2013 | Robertson et al. | |
| 2014/0155268 A1* | 6/2014 | Shen et al. | 505/162 |

FOREIGN PATENT DOCUMENTS

| | | |
|---|---|---|
| CN | 1957844 A | 5/2007 |
| CN | 101025438 A | 8/2007 |
| CN | 101221000 A | 7/2008 |
| CN | 201177660 Y | 1/2009 |
| CN | 101493505 A | 7/2009 |
| CN | 101728050 A | 6/2010 |
| CN | 101118798 A | 12/2010 |
| CN | 101688916 A | 5/2013 |
| EP | 1530058 A2 | 5/2005 |
| JP | 2009-61010 A | 6/2009 |

OTHER PUBLICATIONS

Search Report and Written Opinion from PCT Application No. PCT/US12/69713 dated May 7, 2013.

Chinese OA dated Aug. 28, 2015, 16 pages.

* cited by examiner

SYSTEM FOR MAGNETIC FIELD DISTORTION COMPENSATION AND METHOD OF MAKING SAME

CROSS REFERENCE TO RELATED APPLICATION

The present application is a continuation-in-part of and claims priority to U.S. Non-Provisional application Ser. No. 13/690,312, filed Nov. 30, 2012, which claims priority to U.S. Provisional Application Ser. No. 61/577,805, filed Dec. 20, 2011, the disclosures of which are incorporated herein incorporated by reference.

FIELD OF THE INVENTION

Embodiments of the invention relate generally to a magnetic resonance imaging (MRI) system and in particular to a system and apparatus for compensating for magnetic field distortion caused by mechanical vibrations in the MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field and subjected to a uniform magnetic field (polarizing field $B_0$), the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). When a substance such as human tissue is the individual magnetic moments of the spins in the tissue attempt to align with this polarizing field, but precess about it in random order at their characteristic Larmor frequency.

An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body.

Radio frequency (RF) coils are used to create pulses of RF energy at or near the resonance frequency of the hydrogen nuclei. The RF coils are used to add energy to the nuclear spin system in a controlled fashion. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. As the nuclear spins then relax back to their rest energy state (i.e., after the excitation signal $B_1$ is terminated), they give up energy in the form of an RF signal. This signal is detected by the MRI system and is transformed into an image using a computer and known reconstruction algorithms.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

During an MRI scan, the MRI system experiences mechanical vibrations caused by various external and internal sources. For example, vibrations may be caused by the strong magnetic field environment and various elements of the MRI system, such as the coldhead motor or gradient coil (e.g., as a result of pulsing of the gradient coil), and by external sources such as floor vibrations caused by a nearby elevator or subway. The mechanical vibrations of such sources can cause the mechanical vibration of other elements inside the MRI system, such as the cryostat thermal shield, and induce eddy currents in electrically conductive material in the cryostat (e.g., the vacuum vessel, thermal shield, helium vessel). Such vibrations cause eddy currents to be induced on the metal structures of the MRI system. The eddy currents induce a magnetic field that is superimposed on the original homogeneous magnetic field generated by the MR system, which negatively affects the magnetic field homogeneity, causes artifacts on the image, and deteriorates image quality. The higher the main magnetic field is, the higher the induced eddy current will be and hence the higher the magnetic field distortion.

Attempts have been made to mitigate eddy current formation in MR systems by using software compensation models, providing vibration isolation pads, or designing the suspension system and components of the magnet structure to have a high stiffness to resist vibrations. However, such methods may not adequately mitigate induced eddy currents. Such methods also add cost and complexity to the MR system and increase the computational complexity of the image reconstruction process.

It would be desirable to provide a system and apparatus to passively (e.g., automatically) cancel or reduce the magnetic field distortion caused by eddy currents induced by mechanical vibrations.

BRIEF DESCRIPTION OF THE INVENTION

In accordance with one aspect of the invention, an MR imaging apparatus includes cryostat for a magnetic resonance imaging (MRI) system. The cryostat includes a vacuum casing having a vacuum therein. A cryogen vessel is disposed within the casing, the vessel having a coolant therein. A thermal shield is disposed between the vacuum casing and the cryogen vessel. An eddy current compensation assembly is disposed within the casing. The eddy current compensation assembly includes a plurality of electrically conductive loops formed on one of the vacuum casing, the cryogen vessel, and the thermal shield and constructed to mitigate vibration-induced eddy currents in the MRI system.

In accordance with another aspect of the invention, a method of manufacturing a magnetic resonance imaging (MRI) apparatus is set forth. The method includes providing a vacuum vessel, providing a helium vessel, and providing a thermal shield positioned between the vacuum vessel and the helium vessel. The method also includes forming an eddy current compensation assembly on a surface of one of the vacuum vessel, the helium vessel, and the thermal shield to mitigate vibration-induced eddy currents in the MRI apparatus, wherein the eddy current compensation assembly includes a plurality of electrically conductive closed loops. Further, the method includes assembling the vacuum vessel, the helium vessel, and the thermal shield to form a cryostat to house a superconducting magnet.

In accordance with yet another aspect of the invention, a magnetic resonance imaging (MRI) apparatus includes a magnetic assembly comprising a superconducting magnet having a bore therethrough. The MRI apparatus also includes a plurality of gradient coils positioned about the bore of the superconducting magnet to impress a polarizing magnetic field, an RF transceiver system, and an RF switch controlled by a pulse module to transmit RF signals to an RF coil assembly to acquire MR images. The magnetic assembly includes a helium vessel surrounding the superconducting magnet, a thermal shield surrounding the helium vessel, a vacuum vessel surrounding the thermal shield, and an eddy current compensation assembly having a matrix of electrically conductive loops coupled to one of the vacuum vessel, the helium vessel, and the thermal shield.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
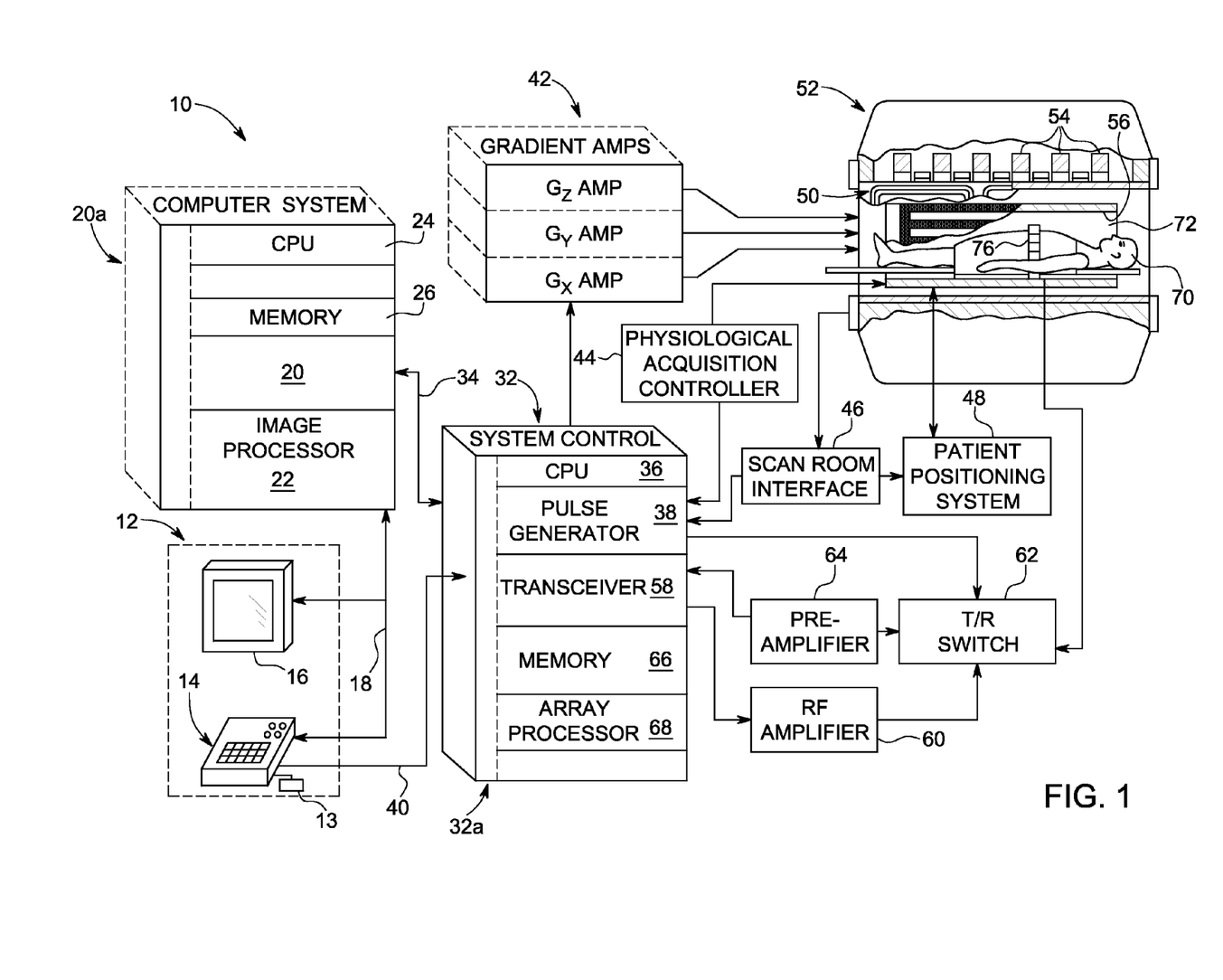
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
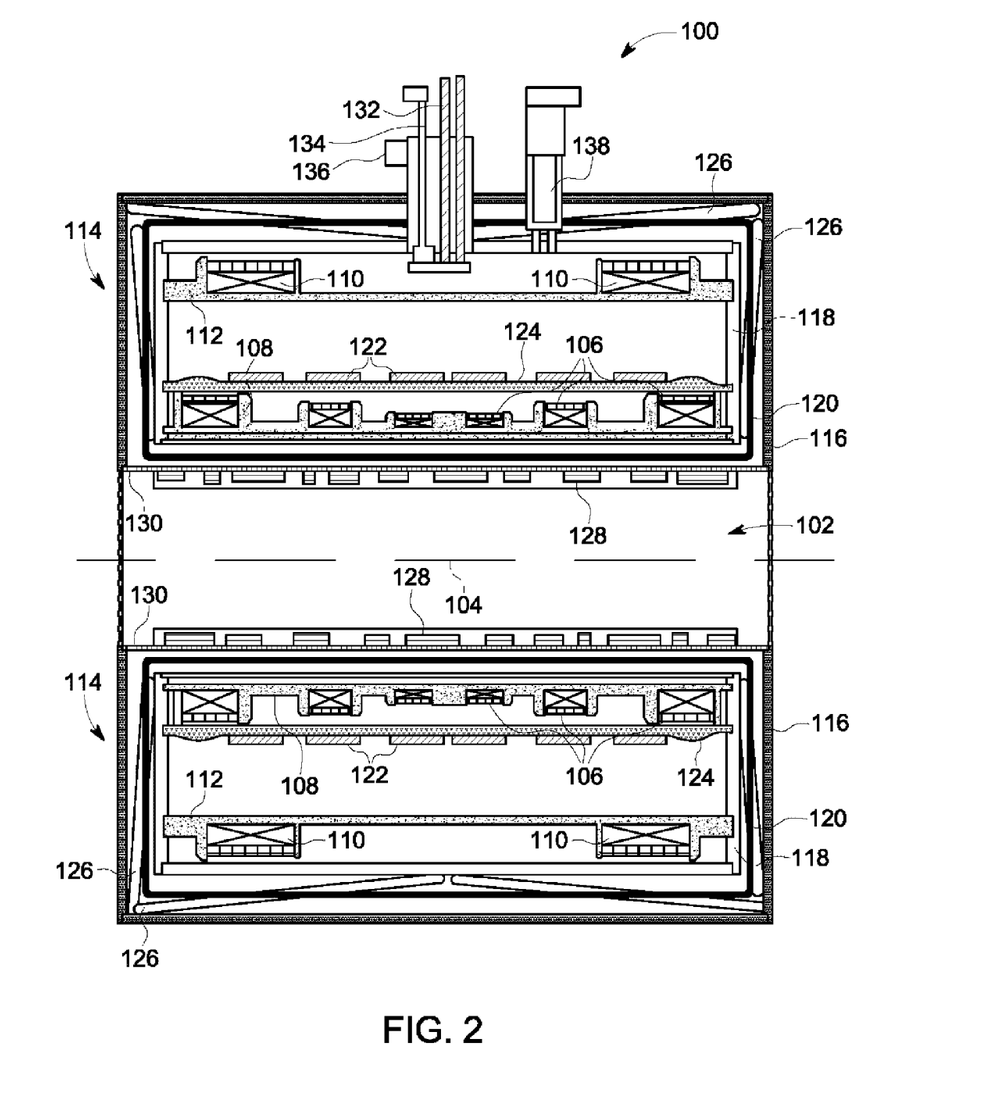
FIG. 2 is a schematic cross-sectional side elevation view of a magnet assembly useable in the MR imaging system of FIG. 1, in accordance with an embodiment of the invention.

Referring to FIG. 2, a schematic cross-sectional side elevation view of a magnet assembly 100 is illustrated in accordance with an embodiment of the invention. Magnet assembly 100 may be used in a resonance assembly, such as resonance assembly 52 of MRI system 10 shown in FIG. 1. Magnet assembly 100 is cylindrical in shape and surrounds a cylindrical patient volume 102. A center axis 104 is aligned parallel to the direction of the main magnetic field, $B_0$, generated by main superconducting coils 106 of magnet assembly 100. Main superconducting coils 106 comprise several radially aligned and longitudinally spaced apart superconducting coils, each capable of carrying a large current. As mentioned, main superconducting coils 106 designed to create the main magnetic field, $B_0$, within patient volume 102. Main superconducting coils 106 are positioned on a main coil former 108, which is cylindrical in shape and provides support for main superconducting coils 106 and inter-coil forces. An outer set of superconducting bucking or shielding coils 110 are used to provide, for example, control of stray magnetic fields. Bucking coils 110 are positioned on a bucking coil former 112, which is cylindrical in shape and provides support for bucking coils 110 and inter-coil forces.

Main superconducting coils 106 and bucking coils 110 are enclosed in a cryostat 114 to provide a cryogen environment designed to maintain the temperature of the superconducting coils below the appropriate critical temperature so that the superconducting coils are in a superconducting state with zero resistance. Cryostat 114 includes a casing having a vacuum therein 116, a cryogen vessel 118, and a thermal shield 120. Main superconducting coils 106 and bucking coils 110 are enclosed within helium vessel 118, which is designed to provide the operational environment (e.g., to contain and cool) for the superconducting coils. A set of superconducting active shim coils 122 may also be disposed within cryogen vessel 118 and are used to provide manufacturing tolerance compensation. Shim coils 122 are positioned on a former 124 which is cylindrical in shape. Cryogen vessel 118 is disposed within casing or vacuum vessel 116, which is configured to maintain a vacuum environment and is used to control the thermal load. Cryogen vessel 118 is filled with a liquid coolant such as, for example, helium. As such, the terms cryogen vessel 118 and helium vessel 118 are used interchangeably herein. However, one skilled in the art will recognize that cryogen vessel 118 may be filled with liquid coolants other than helium.

Thermal shield 120 is disposed between vacuum vessel 116 and helium vessel 118. Thermal shield 120 is used to cool and control the coldmass thermal load. Suspension members 126 are positioned between helium vessel 118 and vacuum vessel 116 to provide mechanical support of the coldmass and thermal shield 120. Passive shims 128 may be positioned on an inner cylindrical surface 130 (or warm bore) of vacuum vessel 116 to provide manufacturing tolerance compensation. Main leads 132 are used to provide current input to the main superconducting coils 106 and a shim lead 134 is used to provide current input to active shim coils 122. Instrumentation 136 is used to monitor magnet parameters. Various other elements such as covers, end caps, supports, brackets, etc. are omitted from FIG. 2 for clarity.

A coldhead 138 (including, for example, a recondenser) is used to manage the cryostat heat loads with, preferably, zero helium boil-off. During operation of magnet assembly 100, coldhead 138 generates mechanical vibrations (e.g., from a motor) that cause induced eddy currents in thermal shield 120 as well as in other elements in the cryostat with electrically conductive material. In addition, the mechanical vibrations of coldhead 138 may cause mechanical vibration of thermal shield 120. Eddy currents may be induced when thermal shield 120 is alternated (or vibrates) in a z-axis direction, an x-axis direction, and/or a y-axis direction. Eddy currents may also be induced due to mechanical vibrations from the MR system site environment or other support structure to which the magnet assembly 100 coupled and from vibrations caused by the gradient coil assembly (e.g., assembly 50 of FIG. 1) and other components of magnet assembly 100. The induced eddy currents cause magnetic field distortion and homogeneity degradation of the main magnetic field, $B_0$. The magnetic field distortion can cause image distortion and affect image quality. To reduce, cancel or compensate the magnetic field distortion, an eddy current compensation assembly 140 (FIG. 3) is incorporated within cryostat 114, as described in more detail below.

Figure 3:
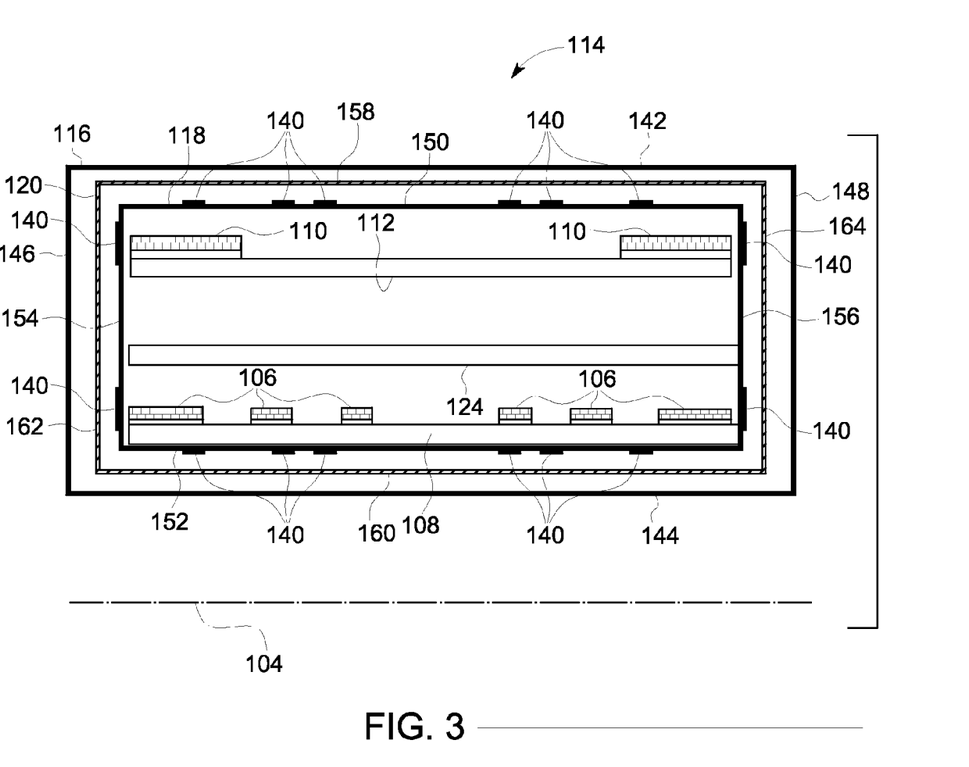
FIG. 3 is a schematic cross-sectional block diagram of a portion of a cryostat in accordance with an embodiment of the invention.

FIG. 3 is a schematic cross-sectional block diagram of a portion of cryostat 114 in accordance with an embodiment of the invention. As explained with respect to FIG. 2, cryostat 114, which includes a vacuum vessel 116, helium vessel 118, and thermal shield 120, provides a cryogenic environment for superconducting coils (e.g., 106, 110) that are positioned inside cryostat 114. Vacuum vessel 116 comprises an outer cylinder 142 and an inner cylinder 144 coupled together by a pair of end flanges 146, 148. Likewise, helium vessel 118 comprises an outer cylinder 150 and an inner cylinder 152 coupled by a pair of end flanges 154, 156. Thermal shield 120, which is positioned between vacuum vessel 116 and helium vessel 118, includes an outer cylinder 158 and an inner cylinder 160 coupled together by a pair of end flanges 162, 164. Various superconducting coils are housed within helium vessel 154 including, for example, main superconducting coils 106, bucking coils 110, and active shim coils 122 (not shown) of FIG. 2. Main superconducting coils 106 are disposed on main coil former 108; bucking coils 110 are disposed on bucking coil former 112. A shim coil former (not shown) may also be used to support active shims (not shown), such as active shim coils 122 of FIG. 2. One skilled in the art will recognize that various other elements such as covers, supports, suspension members, brackets, cold head, current leads, etc. have been omitted from FIG. 3 for clarity.

Eddy current compensation assembly 140 is constructed such that a compensation current is passively induced within eddy current compensation assembly 140 during the imaging process that substantially mitigates or cancels eddy currents induced due to mechanical vibrations within magnet assembly 100. Since the amplitude and damping of the vibrations that induce the eddy currents vary throughout the cryostat 114, the induced eddy currents are positive in some areas and negative in other areas. Further, the magnitude of the induced eddy currents varies by location. Accordingly, eddy current compensation assembly 140 is strategically constructed and positioned within cryostat 114 to account for the variance in the induced eddy currents throughout cryostat 114. By strategically sizing and placing eddy current compensation assembly 140 within cryostat 114, the eddy current compensation assembly 140 can (1) enhance the negative eddy currents and amplify the magnetic field FOV contribution if the positive eddy current contribution from the vibrations to the FOV is larger than the contribution of the negative eddy currents and (2) enhance the positive eddy currents and amplify the magnetic field-of-view (FOV) contribution if the negative current contribution from vibration to the FOV is larger than the contribution of the positive eddy currents.

In one embodiment, portions of eddy current compensation assembly 140 are positioned at one or more locations on end flanges 162, inner cylinder 160, and/or outer cylinder 158 of helium vessel 118, as shown in FIG. 3. However, as discussed further below, eddy current compensation assembly 140 may be positioned at any number of various locations on vacuum vessel 116, helium vessel 118, and/or thermal shield 120, according to various embodiments in order to minimize the total magnetic field contribution to the imaging volume from the eddy currents induced from vibrations and the compensation currents passively induced in eddy current compensation assembly 140.

According to one embodiment, eddy current compensation assembly 140 comprises a matrix of symmetrical pairs of closed loops formed from an electrically conductive material and affixed to a surface of cryostat 114. As described in more detail below with respect to FIGS. 4, 5, and 6, the matrix of closed loops are arranged in independent sets/sub-assemblies for passively generating compensation currents that substantially mitigate or cancel out the eddy current contributions to the magnetic field in the axial direction (i.e., z-direction) and transverse directions (i.e., x- and y-directions).

Eddy current compensation assembly 140 is constructed from a non-superconducting, electrically conductive material such as, for example, aluminum, copper, silver, or combinations thereof. In one embodiment, eddy current compensation assembly 140 is an adhesive tape or sheet affixed to cryostat 114 using fasteners or adhesives. In a preferred embodiment, eddy current compensation assembly 140 is a self-adhesive copper tape. However, one skilled in the art will recognize that eddy current compensation assembly 140 may be constructed from any number of electrically conductive materials having a desired electrical conductivity to induce current therein.

Figure 4:
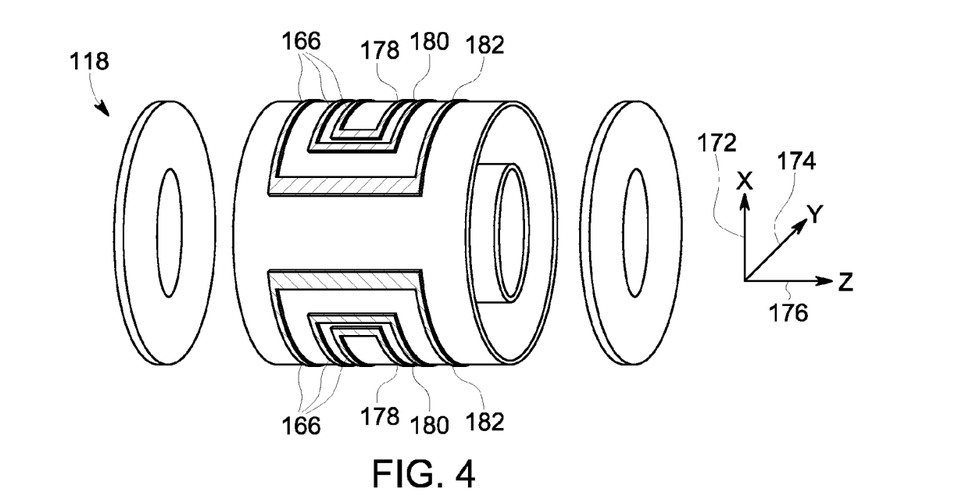
FIG. 4 is an exploded view of a cryogen vessel illustrating a set of x-direction eddy current compensation loops in accordance with an embodiment of the invention.
Figure 5:
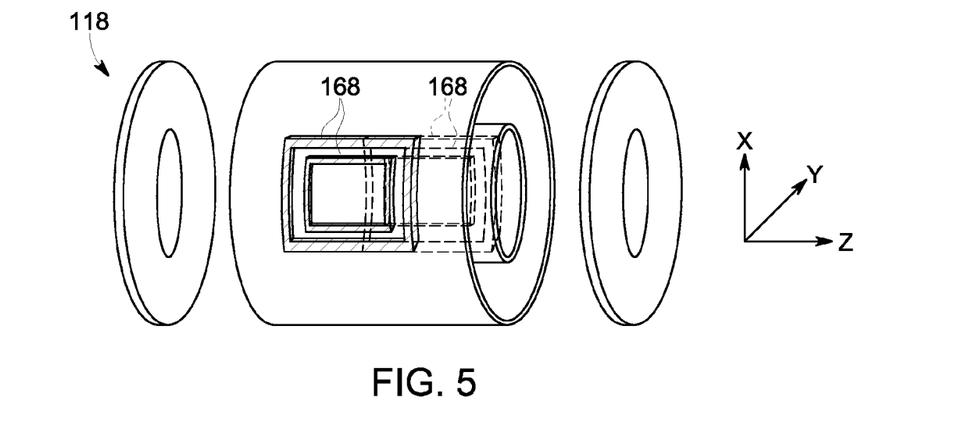
FIG. 5 is an exploded view of a cryogen vessel illustrating a set of y-direction eddy current compensation loops in accordance with an embodiment of the invention.
Figure 6:
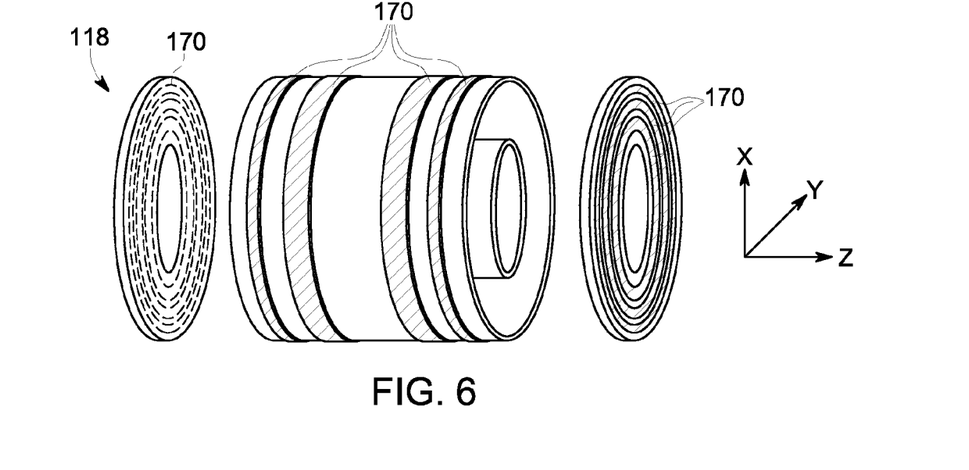
FIG. 6 is an exploded view of a cryogen vessel illustrating a set of z-direction eddy current compensation loops in accordance with an embodiment of the invention.

Referring now to FIGS. 4, 5, and 6, schematic exploded views of helium vessel 118 are provided to illustrate eddy current compensation assembly 140 according to exemplary embodiments of the invention. As shown, eddy current compensation assembly 140 comprises three sub-assemblies 166, 168, 170 in which compensation current is induced to substantially cancel or mitigate eddy currents induced in the x-, y-, and z-directions. For ease of explanation of the position of each sub-assembly, sub-assemblies 166, 168, 170 are separately depicted in FIGS. 4, 5, and 6, respectively, with the other two sub-assemblies being removed for purposes of illustration. Although sub-assemblies 166, 168, 170 are depicted separately in FIGS. 4, 5, and 6, one skilled in the art will recognize that eddy current compensation assembly 140 includes sub-assemblies 166, 168, 170 being positioned together on helium vessel 118 to induce a compensation current in the x-, y-, and z-directions. The compensation current opposes the induced eddy currents, thereby cancelling or substantially mitigating the magnetic field distortion caused by the induced eddy currents.

FIG. 4 illustrates a set of x-direction compensation loops 166 positioned on helium vessel 118. The set of x-direction compensation loops 166 passively induce a compensation current in the transverse, x-axis direction, 172 that cancels positive and negative eddy currents induced due to vibrations along the same, x-axis direction 172. As shown, x-direction compensation loops 166 may be configured in a saddle shape according to one embodiment. Likewise, FIG. 5 illustrates a set of y-direction compensation loops 168 in which a compensation current is induced during imaging that compensates for positive and negative eddy currents induced due to vibrations along the transverse, y-axis direction 174. A set of z-direction compensation loops 170 is illustrated in FIG. 6, in which a compensation current is induced to mitigate or cancel positive and negative eddy currents induced due to vibration in the axial, z-axis direction 176.

In alternate embodiments, eddy current compensation assembly 140 may include only one or two of sub-assemblies 166, 168, 170. Also, dependent on the size and geometry of sub-assemblies 166, 168, 170, it is contemplated that sub-assemblies 166, 168, 170 may overlap one another. Further, the size, shape, and location of sub-assemblies 166, 168, and/or 170 may be varied to accomplish the desired eddy current compensation. The shape, location and number of sub-assemblies 166, 168, 170 may be based on, for example, the amount of cancellation or compensation needed in the imaging volume, the distance from the thermal shield 120, the design needed to magnetically couple with the thermal shield 120, etc.

In one embodiment, pairs of compensation loops of sub-assemblies 166, 168, 170 are constructed to accomplish substantially cancel eddy currents induced due to specific frequencies. For example, a first loop pair 178 of sub-assembly 168 may be positioned and sized to cancel eddy currents induced in the x-direction due to a first vibrational frequency (e.g., 80 Hz), a second loop pair 180 of sub-assembly 168 may be positioned and sized to cancel eddy currents induced in the x-direction due to a second vibrational frequency (e.g., 50 Hz), and a third loop pair 182 of sub-assembly 168 may be positioned and sized to cancel eddy currents induced in the x-direction due to a third vibrational frequency (e.g., 30 Hz). Additional loop pairs may be included to cancel eddy currents over a desired range of frequencies such as, for example, a range of 1-120 Hz.

While eddy current compensation assembly 140 is described above as an electrically conductive tape or sheet affixed to a surface of cryostat 114, eddy current compensation may also be achieved by varying the thickness of vacuum vessel 116, helium vessel 118, and/or thermal shield 120 at select locations to form raised, closed loops on select surfaces of vacuum vessel 116, helium vessel 118, and/or thermal shield 120 within which compensation current is passively induced. For example, an eddy current compensation assembly may be formed by machining a matrix of raised loops into the bulk material of the thermal shield, vacuum vessel, and/or helium vessel to modify the electrical conductivity of the imaging volume, as described in more detail with respect to FIG. 7.

Figure 7:
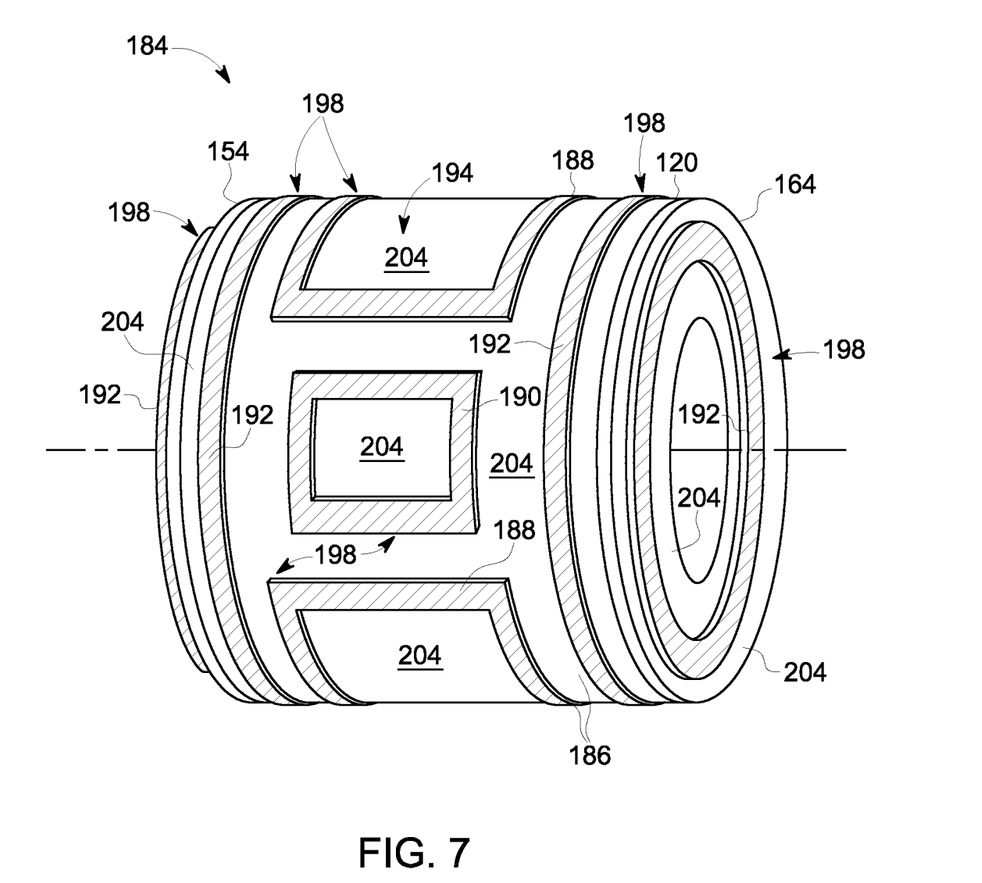
FIG. 7 is a perspective view of a thermal shield having an eddy current compensation assembly formed therein, in accordance with an embodiment of the invention.

Referring now to FIG. 7, an eddy current compensation assembly 184 is formed in the bulk material 186 of thermal shield 120, according to another embodiment of the invention. Unlike eddy current compensation assembly 140 (FIGS. 4-6), which comprises an electrically conductive tape or sheet that is affixed to one or more surfaces of cryostat 114, eddy current compensation assembly 184 is formed by manufacturing raised loops into the bulk material 186 of thermal shield 120. More specifically, eddy current compensation assembly 184 is formed by selectively varying the thickness of thermal shield 120 to form a matrix of x-direction compensation loops 188, y-direction compensation loops 190, and/or z-direction compensation loops 192. In operation, compensation currents are induced in the raised compensation loops 188, 190, 192. These induced compensation currents mitigate or cancel vibration-induced eddy currents.

Figure 8:
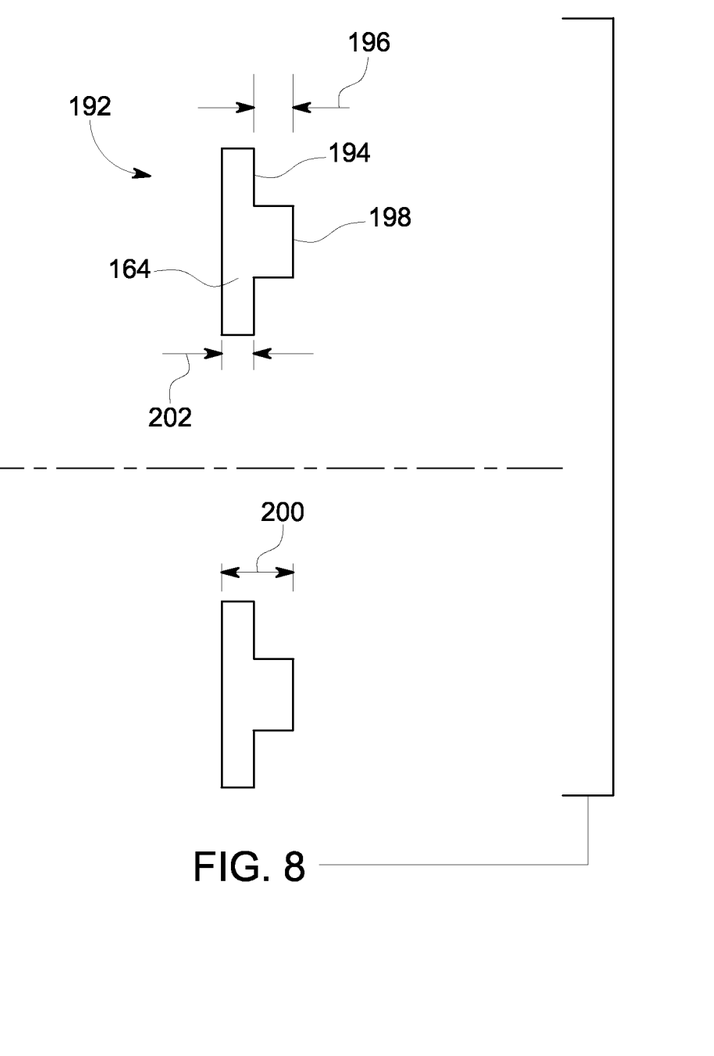
FIG. 8 is a cross-sectional view of an end flange of the thermal shield of FIG. 8.

As shown in FIG. 8, compensation loops 192 are raised away from the main surface 194 of thermal shield 120 by a distance 196. Compensation loops 188, 190 (not shown) are raised from the main surface 194 of thermal shield 120 in a similar manner. Thus, the portion 198 of thermal shield 120 that includes compensation loops 188, 190, 192 has a thickness 200 that is greater than the thickness 202 of the portion 204 of thermal shield 120 that is adjacent to portion 198 and does not include any compensation loops. As used herein, thickness refers to a radial thickness measured between outer and inner surfaces of thermal shield 120.

As eddy current compensation assembly 184 is manufactured as a part of thermal shield 120, eddy current compensation assembly 184 is formed of the same material as thermal shield 120. Thus, in embodiments where thermal shield 120 is formed of aluminum, eddy current compensation assembly 184 is likewise aluminum and has substantially similar material properties as bulk material 186 of thermal shield 120.

In alternative embodiments, however, it is contemplated that the material properties of the portion 198 of thermal shield 120 that includes compensation loops 188, 190, 192 may differ from the material properties of bulk material 186. As one example, first portion 198 of thermal shield 120 may be constructed having enhanced electrical conductivity compared with that of bulk material 186 such as by depositing a conductive coating to the surface of thermal shield 120 or by impregnating the portion 198 of thermal shield 120 that includes compensation loops 188, 190, 192 with an electrically conductive material. In such embodiments, first portion 198 may have a substantially similar thickness as the thickness of portion 204.

Referring back to FIG. 7, while the individual compensation loops of first portion 198 are illustrated as having a common thickness, it is contemplated that the thickness of compensation loops 188, 190, 192 may be varied at different locations on thermal shield 120 to accomplish the desired eddy current compensation. Further, the location, shape, and thickness of compensation loops 188, 190, 192 may be modified in any number of ways in order to induce a desired compensation current to substantially modify or cancel eddy currents induced due to a range of different vibrational frequencies or magnet assembly geometries, similar to that described with respect to eddy current compensation assembly 140 (FIGS. 4-6). Still further, while eddy current compensation assembly 184 is shown in FIG. 7 as being formed on outer cylinder 150 and end flanges 154, 164 of thermal shield 120, one skilled in the art will recognize that eddy current compensation assembly 184 may similarly be formed on alternative or additional surfaces of thermal shield 120, helium vessel 118 (FIG. 3), and/or vacuum vessel 116 (FIG. 3), in accordance with embodiments of the invention.

While embodiments of the invention have been described herein with respect to a symmetrical, closed bore magnet assembly, one skilled in the art will recognize that the techniques set forth herein may be applied to any system geometry. For example, in an alternative embodiment, the magnet assembly may have an open architecture as illustrated with respect to FIG. 9. In such an embodiment, eddy current compensation assembly may have a non-symmetrical configuration to match the non-symmetrical configuration of the magnet assembly (whereas the matrix of loops in a symmetrical magnet assembly is symmetrical in the x-, y-, and z-directions, as described with respect to FIGS. 4-7).

Figure 9:
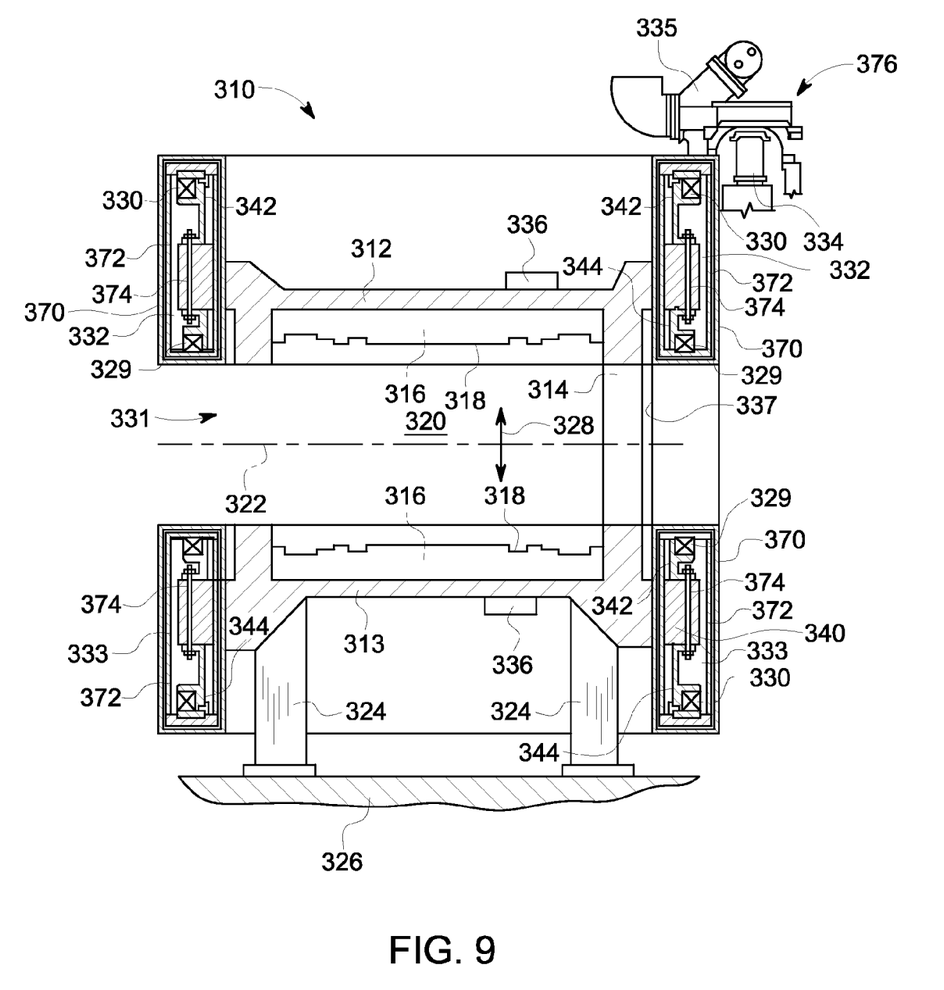
FIG. 9 is a simplified cross-sectional side view of an exemplary open architecture magnet assembly, in accordance with an embodiment of the invention.

Referring now to FIG. 9, a simplified cross-sectional side view of an exemplary open architecture magnet assembly 310 is illustrated in accordance with an embodiment. Open architecture superconducting magnet assembly 310 includes spaced parallel pole pieces 312 and 313 separated and supported at one end by a pair of non-magnetic connecting members or posts 314. Pole pieces 312 and 313 are of ferromagnetic material such as iron. Pole faces 316 are shaped 318 to improve magnetic field inhomogeneity within imaging region 320 along axis 322 of superconducting magnet assembly 310. Supports 324 secure the superconducting magnet assembly 310 to floor 326.

The main magnetic field, $B_0$, indicated generally by arrow 328 within imaging region 320 is generated by main superconducting magnet coils 329 within helium vessels 332 and 333. An outer set of superconducting bucking or shielding coils 330 are also positioned within helium vessels 332 and 333 and are used to provide, for example, control of stray magnetic fields. Spaced helium vessels 332 and 333 are cylindrical members providing an open end 331 to imaging region 320. Magnetic field shimming apparatus such as active shim coils (not shown) within cryogen vessels 332 and 333 and passive shims in external shim drawers indicated generally as 336 compensate for magnetic field inhomogeneities within imaging region 320 in the manner well known in the art. Helium vessels 332 and 333 are disposed within a cryogen pressure vessel or vacuum vessel 370. A thermal shield 372 is disposed between vacuum vessel 370 and helium vessels 332 and 333. Superconducting magnet coils 329 and 330 are assembled into a magnet assembly with cold iron ring 340 interposed between the coils. Main coils 329 and bucking coils 330 are supported on coil formers or supports 344 and 342 (e.g., composed of glass fiber-epoxy composite), respectively, in pockets machined for the coils. Active shim coils (not shown) are positioned on a former 374.

A condenser 334 and associated mechanical cryocooler 335 (together part of a coldhead 376) recondenses helium gas which results from the superconducting operation back to liquid helium. The recondensed liquid helium flows from recondenser 334 by gravity into upper helium vessel 332. A vertical transfer tube 337 interconnects helium vessels 332 and 333 and enables the gravity flow of helium from upper helium vessel 332 to lower helium vessel 333. As mentioned above with respect to FIG. 2, during operation of the magnet assembly 310, coldhead 376 generates mechanical vibrations (e.g., from a motor) that cause induced eddy currents in the thermal shield 372 as well as in other elements in the cryostat with electrically conductive material. In addition, the mechanical vibrations of the coldhead 376 may cause mechanical vibration of the thermal shield 372. For example, eddy currents may be induced when the thermal shield 372 is alternated (or vibrates) in a z-axis direction, an x-axis direction or a y-axis direction. The eddy currents induced by the mechanical vibrations will cause magnetic field distortion and homogeneity degradation of the main magnetic field, B0. The magnetic field distortion can cause image distortion and affect image quality. To reduce, cancel or compensate the magnetic field distortion, an eddy current compensation assembly (not shown), similar to eddy current compensation assembly 140 or eddy current compensation assembly 184 is incorporated inside the magnet assembly 310, as described in more detail with respect to FIG. 10. In a preferred embodiment, sets of eddy current compensation loops are provided for each orthogonal direction (x, y, z). In other embodiments, multiple sets of coils may be used for each orthogonal direction. Similar to eddy current compensation assembly 140 (FIGS. 4-6) or eddy current compensation assembly 184 (FIG. 7), one skilled in the art will recognize that the eddy current compensation assembly may be formed at various locations and surfaces of upper helium vessel 332, lower helium vessel 333, vacuum vessel 370, and/or thermal shield 372.

Figure 10:
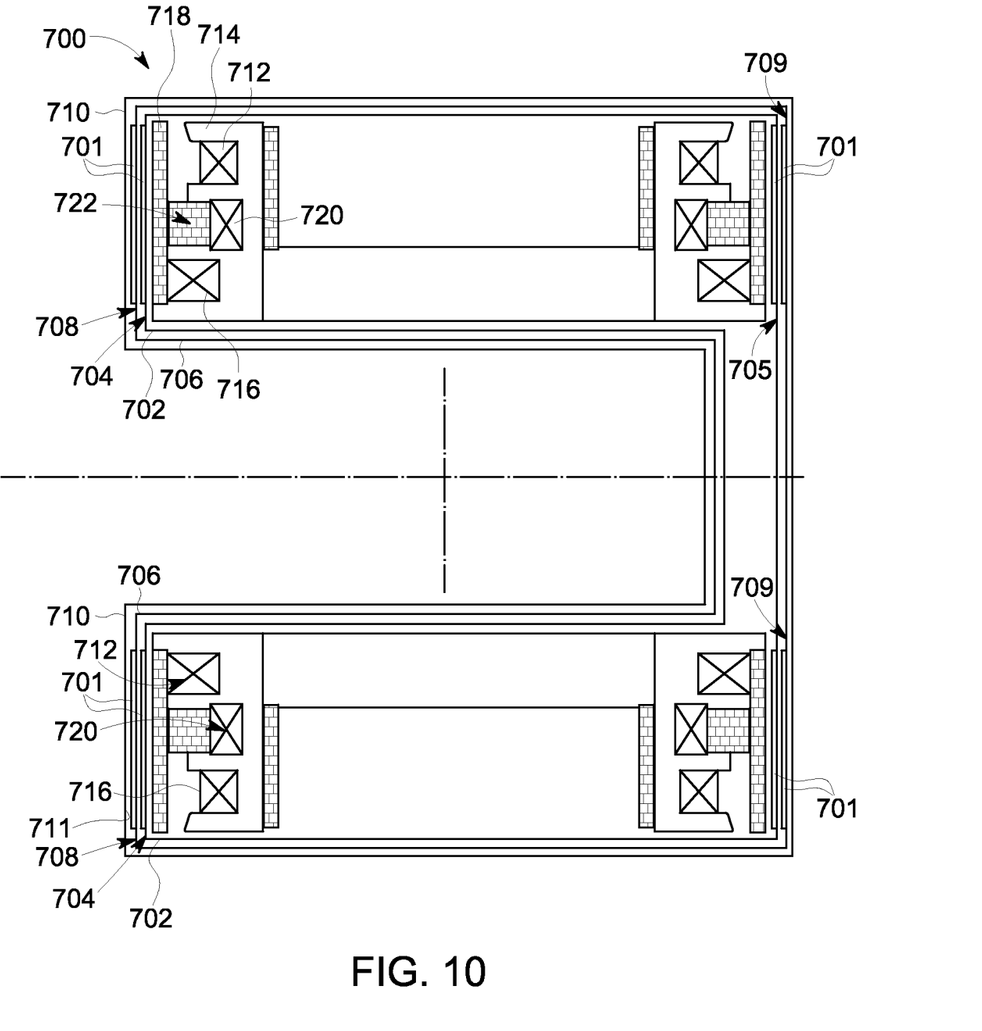
FIG. 10 is a schematic cross-sectional block diagram of an open architecture magnet assembly cryostat showing exemplary locations for an eddy current compensation assembly, in accordance with an embodiment of the invention.

FIG. 10 is a schematic cross-sectional block diagram of an open architecture magnet assembly cryostat 700 showing exemplary locations for an eddy current compensation assembly 701 in accordance with one embodiment of the invention. Cryostat 700 includes a vacuum vessel 710 and a helium vessel 702 disposed within the vacuum vessel. A thermal shield 706 is positioned between the vacuum vessel 710 and the helium vessel 702. Various superconducting coils are housed within the helium vessel 702 including, for example, main coils 712, bucking coils 716 and active shims 720. Main coils 712 are disposed on a main coil former 714. Bucking coils 716 are disposed on a bucking coil former 718. A shim coil former 722 is used to support active shims 720. Various other elements such as covers, supports, suspension members, brackets, cold head, current leads, etc. are omitted from FIG. 7 for clarity.

In one embodiment, an electrically conductive non-superconducting material is used to construct the eddy current compensation assembly 701. Example locations for the passive compensation loops of eddy current compensation assembly 701 are an inner surface 711 of vacuum vessel 710, an outer surface 704 of the helium vessel 702, an inner surface 705 of the helium vessel 702, an outer surface 708 of the thermal shield 706, and/or an inner surface 709 of thermal shield 706. However, one skilled in the art will recognize that the passive compensation loops of eddy current compensation assembly 701 may be formed on various other surfaces within cryostat 700.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, according to one embodiment of the invention, an MR imaging apparatus includes cryostat for a magnetic resonance imaging (MRI) system. The cryostat includes a vacuum casing having a vacuum therein. A cryogen vessel is disposed within the casing, the vessel having a coolant therein. A thermal shield is disposed between the vacuum casing and the cryogen vessel. An eddy current compensation assembly is disposed within the casing. The eddy current compensation assembly includes a plurality of electrically conductive loops formed on one of the vacuum casing, the cryogen vessel, and the thermal shield and constructed to mitigate vibration-induced eddy currents in the MRI system.

According to another embodiment of the invention, a method of manufacturing a magnetic resonance imaging (MRI) apparatus is set forth. The method includes providing a vacuum vessel, providing a helium vessel, and providing a thermal shield positioned between the vacuum vessel and the helium vessel. The method also includes forming an eddy current compensation assembly on a surface of one of the vacuum vessel, the helium vessel, and the thermal shield to mitigate vibration-induced eddy currents in the MRI apparatus, wherein the eddy current compensation assembly includes a plurality of electrically conductive closed loops. Further, the method includes assembling the vacuum vessel, the helium vessel, and the thermal shield to form a cryostat to house a superconducting magnet.

According to yet another embodiment of the invention, a magnetic resonance imaging (MRI) apparatus includes a magnetic assembly comprising a superconducting magnet having a bore therethrough. The MRI apparatus also includes a plurality of gradient coils positioned about the bore of the superconducting magnet to impress a polarizing magnetic field, an RF transceiver system, and an RF switch controlled by a pulse module to transmit RF signals to an RF coil assembly to acquire MR images. The magnetic assembly includes a helium vessel surrounding the superconducting magnet, a thermal shield surrounding the helium vessel, a vacuum vessel surrounding the thermal shield, and an eddy current compensation assembly having a matrix of electrically conductive loops coupled to one of the vacuum vessel, the helium vessel, and the thermal shield.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A cryostat for a magnetic resonance imaging (MRI) system, the cryostat comprising:
   a vacuum casing having a vacuum therein;
   a cryogen vessel disposed within the casing, the vessel having a coolant therein;
   a thermal shield disposed between the vacuum casing and the cryogen vessel; and
   an eddy current compensation assembly disposed within the casing, the eddy current compensation assembly comprising a plurality of electrically conductive loops formed on one of the vacuum casing, the cryogen vessel, and the thermal shield and constructed to mitigate vibration-induced eddy currents in the MRI system;
   wherein at least one surface of the one of the vacuum casing, the cryogen vessel, and the thermal shield has a first portion having the plurality of electrically conductive loops formed therein and a second portion free of the plurality of electrically conductive loops; and
   wherein the first portion has a thickness that is greater than a thickness of the second portion.

2. The cryostat of claim 1 wherein the coolant comprises helium.

3. The cryostat of claim 1 wherein the plurality of electrically conductive loops comprises a non-superconducting material.

4. The cryostat of claim 3 wherein the eddy current compensation assembly further comprises one of aluminum, copper, and silver.

5. The cryostat of claim 4 wherein the eddy current compensation assembly further comprises copper tape.

6. The cryostat of claim 1 wherein the conductive loop portion and the non-conductive loop portion comprise aluminum.

7. The cryostat of claim 1 further comprising an adhesive affixing the eddy current compensation assembly to at least one surface of the one of the vacuum casing, the cryogen vessel, and the thermal shield.

8. The cryostat of claim 1 wherein the eddy current compensation assembly further comprises:
    a first set of compensation loops constructed to mitigate eddy currents induced in an axial direction; and
    a second set of compensation loops constructed to mitigate eddy currents induced in at least one direction transverse to the axial direction.

9. The cryostat of claim 8 wherein the second set of compensation loops comprises:
    a set of x-direction compensation loops; and
    a set of y-direction compensation loops.

10. A method of manufacturing a magnetic resonance imaging (MRI) apparatus comprising:
    providing a vacuum vessel;
    providing a helium vessel;
    providing a thermal shield positioned between the vacuum vessel and the helium vessel;
    forming an eddy current compensation assembly on a surface of one of the vacuum vessel, the helium vessel, and the thermal shield to mitigate vibration-induced eddy currents in the MRI apparatus, the eddy current compensation assembly comprising at least one electrically conductive closed loop formed on an end flange of the one of the vacuum vessel, the helium vessel, and the thermal shield and at least one other electrically conductive closed loop formed on a cylindrical surface of the one of the vacuum vessel, the helium vessel, and the thermal shield; and
    assembling the vacuum vessel, the helium vessel, and the thermal shield to form a cryostat to house a superconducting magnet.

11. The method of claim 10 further comprising affixing the eddy current compensation assembly to the at least one surface of the cryostat using an adhesive.

12. The method of claim 10 further comprising machining the eddy current compensation assembly into a bulk material of the cryostat, wherein machining the eddy current compensation assembly comprises modifying a thickness of the cryostat in a portion of the cryostat that includes the eddy current compensation assembly such that a thickness of the portion of the cryostat that includes the eddy current compensation assembly is greater than a thickness of a portion of the cryostat adjacent to the eddy current compensation assembly.

13. The method of claim 10 further comprising forming the eddy current compensation assembly on an internal surface of one of the vacuum vessel and the thermal shield.

14. The method of claim 10 further comprising forming the eddy current compensation assembly on an external surface of one of the helium vessel and the thermal shield.

15. A magnetic resonance imaging (MRI) apparatus comprising:
    a magnetic assembly comprising a superconducting magnet having a bore therethrough;
    a plurality of gradient coils positioned about the bore of the superconducting magnet to impress a polarizing magnetic field;
    an RF transceiver system;
    an RF switch controlled by a pulse module to transmit RF signals to an RF coil assembly to acquire MR images; and
    wherein the magnetic assembly comprises:
        a helium vessel surrounding the superconducting magnet;
        a thermal shield surrounding the helium vessel;
        a vacuum vessel surrounding the thermal shield; and
        an eddy current compensation assembly comprising a matrix of electrically conductive loops coupled to at least one cylindrical surface and at least one end surface of one of the vacuum vessel, the helium vessel, and the thermal shield.

16. The MRI apparatus of claim 15 wherein the eddy current compensation assembly comprises a non-superconducting tape affixed to a surface of the one of the vacuum vessel, the helium vessel, and the thermal shield.

17. The MRI apparatus of claim 15 wherein the eddy current compensation assembly comprises raised, closed loops machined onto a surface of the one of the vacuum vessel, the helium vessel, and the thermal shield.

18. The MRI apparatus of claim 15 wherein the eddy current compensation assembly comprises:
    at least one electrically conductive loop constructed to mitigate eddy currents induced in the x-direction;
    at least one electrically conductive loop constructed to mitigate eddy currents induced in the y-direction; and
    at least one electrically conductive loop constructed to mitigate eddy currents induced in the z-direction.

19. A method of manufacturing a magnetic resonance imaging (MRI) apparatus comprising:
    providing a vacuum vessel;
    providing a helium vessel;
    providing a thermal shield positioned between the vacuum vessel and the helium vessel;
    forming an eddy current compensation assembly on a surface of one of the vacuum vessel, the helium vessel, and the thermal shield to mitigate vibration-induced eddy currents in the MRI apparatus, the eddy current compensation assembly comprising a plurality of electrically conductive closed loops; and
    assembling the vacuum vessel, the helium vessel, and the thermal shield to form a cryostat to house a superconducting magnet; and
    machining the eddy current compensation assembly into a bulk material of the cryostat.

* * * * *